US008354733B2

(12) United States Patent
Chang (10) Patent No.: US 8,354,733 B2
(45) Date of Patent: Jan. 15, 2013

(54) IGBT POWER SEMICONDUCTOR PACKAGE HAVING A CONDUCTIVE CLIP

(75) Inventor: Hsueh-Rong Chang, Hermosa Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/071,329

(22) Filed: Mar. 24, 2011

(65) Prior Publication Data

US 2012/0223415 A1    Sep. 6, 2012

Related U.S. Application Data

(60) Provisional application No. 61/449,200, filed on Mar. 4, 2011.

(51) Int. Cl.
*H01L 29/00* (2006.01)
(52) U.S. Cl. ............................. 257/579; 257/E21.381
(58) Field of Classification Search .................. 257/579, 257/E21.381
See application file for complete search history.

(56) References Cited

U.S. PATENT DOCUMENTS

2010/0105174 A1* 4/2010 Muto et al. .................... 438/123
2010/0259201 A1* 10/2010 Kawano et al. ............... 315/362

* cited by examiner

*Primary Examiner* — William D Coleman
*Assistant Examiner* — Christine Enad
(74) *Attorney, Agent, or Firm* — Farjami & Farjami LLP

(57) ABSTRACT

According to one disclosed embodiment, a power semiconductor package includes an insulated-gate bipolar transistor (IGBT) residing on a package substrate, where the IGBT includes a plurality of solderable front metal (SFM) coated emitter segments situated atop the IGBT and connected to an emitter of the IGBT. The power semiconductor package also includes a conductive clip coupling the plurality of SFM coated emitter segments to an emitter pad on the package substrate. Additionally, the power semiconductor package includes a gate pad on the package substrate coupled to a gate of the IGBT, a collector pad on the package substrate situated under the IGBT and coupled to a collector of the IGBT, and an emitter terminal, a collector terminal and a gate terminal of the package substrate that are routed to the emitter pad, collector pad, and gate pad, respectively.

20 Claims, 5 Drawing Sheets

Fig. 5 ns and hybrid electric vehicles. Increasing the number of bond wires does not result in a desirable solution since using more bond wires also increases the chance of bond wire failure and results in reduced reliablity.

IGBT POWER SEMICONDUCTOR PACKAGE HAVING A CONDUCTIVE CLIP

The present application claims the benefit of and priority to a pending provisional application entitled "IGBT Power Semiconductor Package Having a Conductive Clip," Ser. No. 61/449,200 filed on Mar. 4, 2011. The disclosure in that pending provisional application is hereby incorporated fully by reference into the present application.

BACKGROUND OF THE INVENTION

1. Field of the Invention

The present invention is generally in the field of semiconductor packaging. More particularly, the present invention is in the field of semiconductor packaging for power semiconductor devices.

2. Background Art

Conventional power semiconductor devices, such as power IGBTs (insulated-gate bipolar transistors) use bond wires, such as aluminum bond wires, for high current conduction, for example from emitter nodes of the IGBTs. Bond wires limit and localize current flow, causing, for example, local hot spots at the bond wire contact site with a bond pad or a contact pad. High power devices, such as IGBTs, have high current carrying capability, but are conventionally limited by the relatively low current carrying capability of bond wires. Moreover, bond wire fatigue has been a major cause in limiting temperature cycles and power cycles for high power switches, such as IGBTs, used in, for example, electric and hybrid electric vehicles. Increasing the number of bond wires does not result in a desirable solution since using more bond wires also increases the chance of bond wire failure and results in reduced reliablity.

Accordingly, there is a need to overcome the drawbacks and deficiencies in the art by providing a power semiconductor package for power devices, such as IGBTs, with increased current handling capability and reliability.

SUMMARY OF THE INVENTION

The present application is directed to an insulated-gate bipolar transistor (IGBT) power semiconductor package having a conductive clip, substantially as shown in and/or described in connection with at least one of the figures, and as set forth more completely in the claims.

DETAILED DESCRIPTION OF THE INVENTION

The present invention is directed to an insulated-gate bipolar transistor (IGBT) power semiconductor package having a conductive clip. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
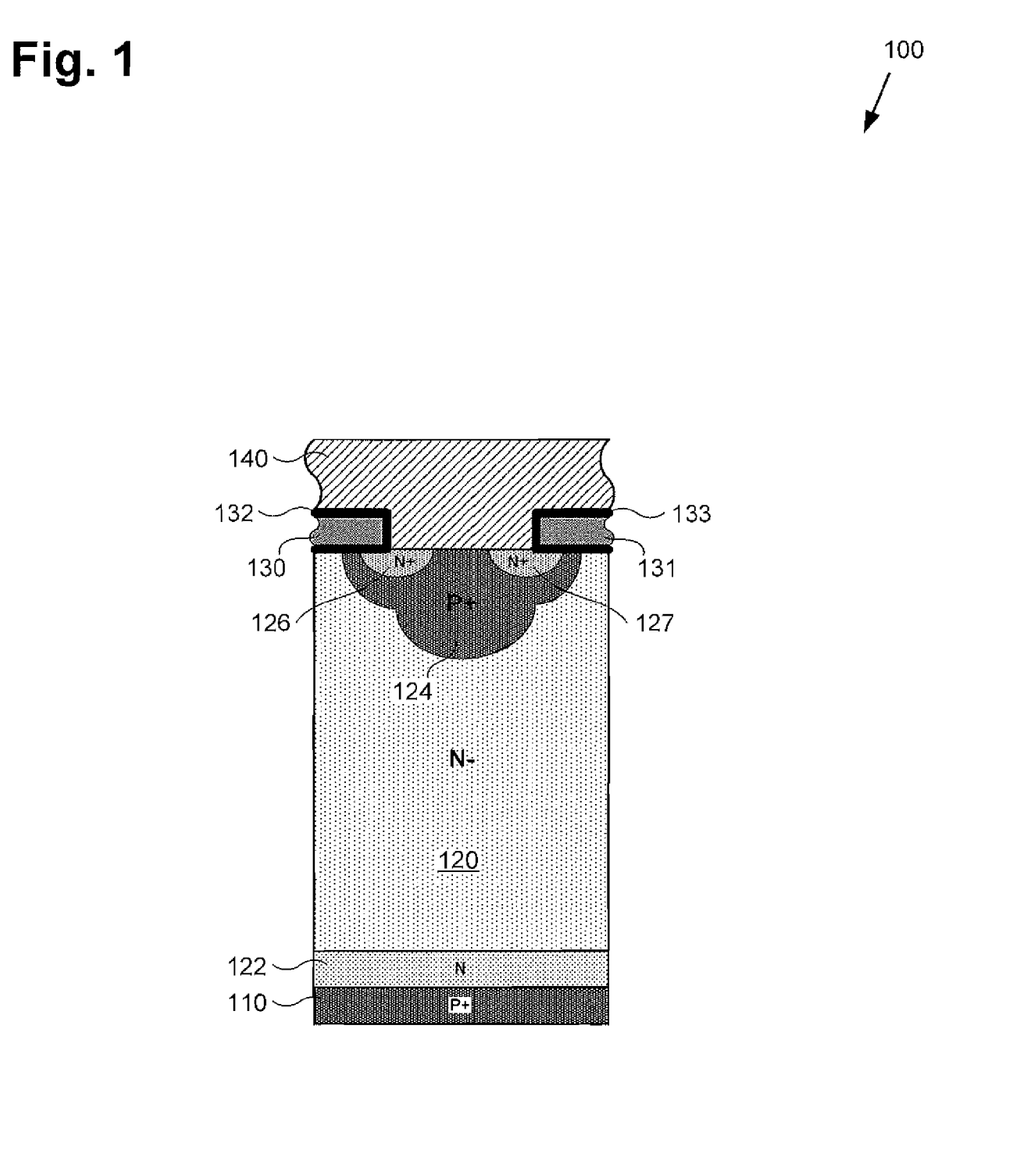
FIG. 1 illustrates an IGBT unit cell.

IGBTs utilized in power delivery systems typically comprise one or more IGBT unit cells that can be electrically coupled to each other to form a single device that can be used to conduct relatively large currents. FIG. 1 illustrates an example of an IGBT unit cell. As shown in FIG. 1, IGBT unit cell 100 may comprise a P+ type substrate 110, N type field stop region 122, N− type high voltage supporting region 120, also referred to as a drift region, polysilicon gates 130 and 131, insulation layers 132 and 133, and conductive layer 140. IGBT unit cell 100 may also comprise P+ type implant region 124 and N+ type implant regions 126 and 127, for example, which may be formed in drift region 120.

Polysilicon gates 130 and 131 may be configured to serve as a gate for IGBT unit cell 100, for example, and thus determine whether IGBT unit cell 100 may enter a conductive state. Polysilicon gates 130 and 131 are typically not configured to conduct large currents, and so may be relatively small and thin compared to, for example, conductive layer 140. For example, a sufficient voltage applied to polysilicon gates 130 and 131 may allow IGBT unit cell 100 to enter a conductive state, wherein relatively large applied currents may flow from P+ type substrate 110 through N type field stop region 122, drift region 120 and P+ type implant region 124 to conductive layer 140, for example. Entering such a conductive state may involve polysilicon gates 130 and 131, N+ type implant regions 126 and 127, and portions of P+ type implant region 124 and N− type drift region 120, in a manner typical to IGBT semiconductor structures, for example.

As shown in FIG. 1, polysilicon gates 130 and 131 may extend beyond the extents of IGBT unit cell 100, for example, and serve as a gate for an entire array of other IGBT unit cells situated in the same die as IGBT unit cell 100, for example. Insulation layers 132 and 133 may comprise any arrangement of one or many different electrically insulating materials, for example, such as multiple silicon oxide layers grown at different times during a semiconductor fabrication process, and may be configured to electrically insulate polysilicon gates 130 and 131 from N− type drift region 120, P+ type implant region 124, N+ type implant regions 126 and 127, and conductive layer 140, thereby allowing polysilicon gates 130 and 131 to serve as a gate for IGBT unit cell 100.

Conductive layer 140 may be configured to electrically couple to P+ type implant region 124, for example, which may be configured to serve as an emitter for IGBT unit cell 100, for example. In some embodiments, conductive layer 140 may comprise a metal, for example, such as aluminum, and may be approximately four microns thick in order to provide sufficient material for a robust electrical and mechanical connection, for example. As shown in FIG. 1, conductive layer 140, like polysilicon gates 130 and 131, may extend beyond the extents of IGBT unit cell 100, for example, and couple to emitters for an entire array of IGBT unit cells situated in the same die as IGBT unit cell 100. In some embodiments, conductive layer 140 may additionally comprise one or more segments (also referred to as "emitter segments" for brevity in the present application) connected to one or more emitters of IGBT unit cells, as will be described more fully below with reference to FIG. 2.

P+ type substrate 110 may comprise any P+ type semiconductor material, for example, that is intrinsically a P+ type material, or that can be doped to become a P+ type material. P+ type substrate 110 may serve as a collector for IGBT unit cell 100, for example, and may be electrically coupled to an array of other IGBT unit cell collectors, for instance, thereby serving as a collector for the entire array, much like conductive layer 140 may be configured to couple emitters for an array of IGBT unit cells.

As shown in FIG. 1, P+ type substrate 110 may be relatively thin with respect to a direction of current flow when IGBT unit cell 100 is in a conductive state, for example, which may advantageously reduce resistive heating in IGBT unit cell 100. IGBT unit cell 100 may include N type field stop region 122 in order to facilitate the operation of IGBT unit cell 100 as a bipolar transistor. In embodiments where P+ substrate 110 is relatively thin, a total thickness of an IGBT comprising an array of IGBT unit cells, such as that shown in FIG. 1, may be approximately 65 to 75 microns. In other embodiments, P+ substrate 110 may be configured to alternatively produce IGBTs with thicknesses of approximately 200 microns.

N− type drift region 120 may comprise any N− type semiconductor material that can be epitaxially grown on another semiconductor material, for example, and that is intrinsically or pre-doped to be a N− type material, or that can be subsequently doped to become a N− type material, for example. N− type drift region 120 may additionally comprise any semiconductor material that can be implanted with P and N type dopants so as to produce P+ type implant region 124 and N+ type implant regions 126 and 127.

Although FIG. 1 presents an IGBT unit cell 100 with a specific arrangement of material layers, it should be understood that this is not meant to limit the scope of the present invention. Other material arrangements for an IGBT unit cell may alternatively or additionally be used to form embodiments of the present invention, for example, as long as those alternative IGBT unit cells include at least a gate, a collector, and an emitter coupled to a conductive layer similar to conductive layer 140, for example, where the collector and the emitter may be configured to conduct current vertically through an IGBT comprising one or more such IGBT unit cells.

Figure 2:
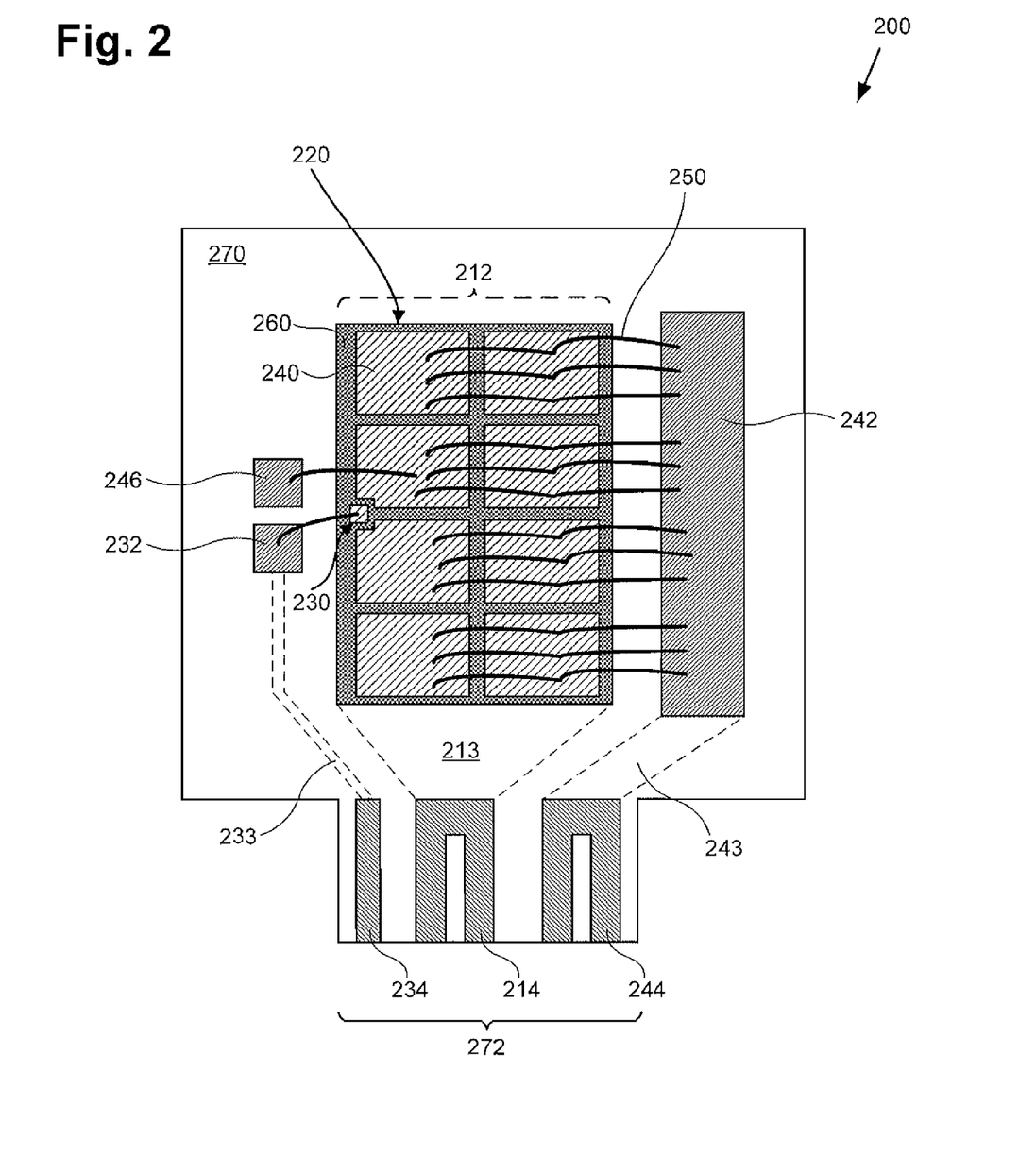
FIG. 2 shows a top view of a conventional semiconductor package for an IGBT.

Turning now to FIG. 2, FIG. 2 shows a top view of a semiconductor package that utilizes bond wires to connect an emitter of an IGBT to external devices. Semiconductor package 200 of FIG. 2 includes collector pad 212 hidden from view by IGBT 220, gate pad 232, emitter pad 242, emitter sensor pad 246, bond wires 250, package substrate 270, and terminal block 272. As such, IGBT 220 resides on collector pad 212 and package substrate 270. As shown in FIG. 2, current applied at collector terminal 214 of terminal block 272 may be routed through collector trace 213 to collector pad 212. Collector pad 212 may be coupled to a bottom surface of IGBT 220, and therefore be electrically coupled to a collector of IGBT 220 situated on a bottom surface of IGBT 220. If sufficient voltage is applied to gate terminal 234, and therefore to gate 230 of IGBT 220 through gate trace 233, gate pad 232 and a bond wire, as shown in FIG. 2, IGBT 220 may enter a conductive state and conduct current from the collector to an emitter on or near a top surface of IGBT 220, for example, which may, in turn, be connected to multiple emitter segments, such as emitter segments 240 of IGBT 220. In the embodiment shown in FIG. 2, that current is then conducted to emitter pad 242 using bond wires, and from there routed to emitter terminal 244 through emitter trace 243.

IGBT 220 may comprise an array of one or more IGBT unit cells, such as IGBT unit cell 100 of FIG. 1. Emitter segments 240 may comprise individual conductive layers, such as conductive layer 140 of FIG. 1, that may be partitioned into multiple segments, as shown in FIG. 2, and may be separated by a non-conductive material, such as passivation material 260. Each emitter segment 240 may couple to emitters for one or more IGBT unit cells situated within IGBT 220, for example. Each corresponding polysilicon gate of a constituent IGBT unit cell may be routed to gate 230 of IGBT 220, which may be used to determine whether IGBT 220 may enter a conductive state, as explained above.

Also shown in FIG. 2 is package substrate 270. Package substrate 270 may comprise any material capable of providing electrical isolation and mechanical support for pads 212, 232 and 242, traces 213, 233 and 243, and terminals 214, 234 and 244 in terminal block 272. Additionally, where semiconductor package 200 includes a means to sense an emitter voltage separate from sensing such voltage at, for example, emitter terminal 244, package substrate 270 may also be used to provide mechanical support for emitter sensor pad 246 coupled by bond wire, for example, to one of emitter segments 240 of IGBT 220. Although not shown in FIG. 2, emitter sensor pad 246 may be configured to couple to an external device through an additional terminal in terminal block 272 or through a separate terminal or pad situated on substrate 272. In one embodiment, package substrate 270 may comprise a material typically used for printed circuit boards (PCBs), such as fiberglass or plastic. In another embodiment, package substrate 270 may comprise a non-conductive ceramic substrate.

As can be seen from FIG. 2, each bond wire requires a substantial amount of surface area to couple emitter segments 240 to each other and to emitter pad 242, but presents a relatively small cross-sectional area with which to conduct current. Increasing the number of current conducting bond wires without also increasing a size of emitter pad 242, for example, is difficult due to one wire blocking placement of additional wires and cross-wire shorting, for example, and because the bonding process can weaken or dislodge previously bonded wires. Moreover, bonds at the ends and along a length of each bond wire are typically susceptible to failure due to repeated thermal cycling, and their fragility and shape makes them relatively difficult to thermally sink. Thus, utilization of bond wires 250 to couple emitter segments 220 to emitter pad 242 substantially limits the scalability of semiconductor package 200, the current carrying ability of semiconductor package 200, and the lifetime of a device packaged using semiconductor package 200.

It is noted that although neither gate pad 232 nor emitter sensor pad 246 are typically expected to conduct large currents, and so do not present all the same problematic limitations with respect to coupling an emitter to an emitter pad, use of bond wires to connect gate pad 232 to gate 230 and emitter sensor pad 246 to one of the emitter segments 240 still requires the relatively large surface area used to attach a bond wire, and each connection is still subject to the general fragility of bond wires, particularly when repetitively thermally cycled.

Figure 3:
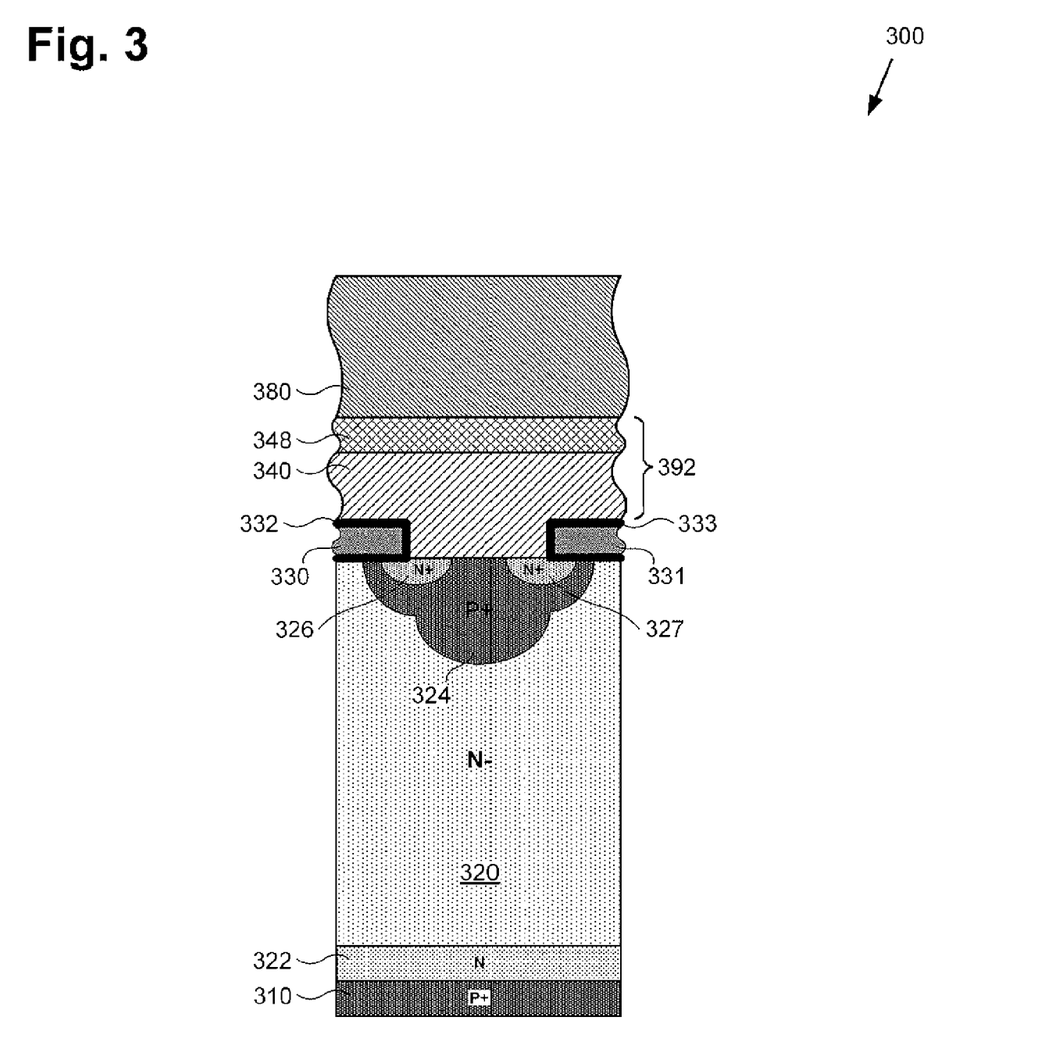
FIG. 3 illustrates an IGBT unit cell, according to an embodiment of the present invention.

FIG. 3 illustrates an embodiment of the present inventive concepts addressing the relatively limited utility of semiconductor package 200 in FIG. 2. FIG. 3 shows an IGBT unit cell 300 similar to IGBT unit cell 100 of FIG. 1. However, IGBT unit cell 300 additionally includes solderable front metal (SFM) layer 348 coating conductive layer 340 and conductive clip 380 situated over emitter segment 392. SFM layer 348 and conductive layer 340 may form a portion of emitter segment 392, which may be configured to connect to an array of emitters of IGBT unit cells like IGBT unit cell 300, analogous to conductive layer 140 connecting to emitters of IGBT unit cells similar to IGBT unit cell 100 in FIG. 1. Conductive clip 380 may be used to conduct current from emitter segment 392 to an emitter pad of a semiconductor package (not shown in FIG. 3), as will be explained more fully below with reference to FIGS. 4 and 5.

Also shown in FIG. 3 are P+ type substrate 310, N type field stop region 322, N− type drift region 320, P+ type implant region 324, N+ type implant regions 326 and 327, polysilicon gates 330 and 331 and insulation layers 332 and 333 corresponding respectively to P+ type substrate 110, N type field stop region 122, N− type drift region 120, P+ type implant region 124, N+ type implant regions 126 and 127, polysilicon gates 130 and 131 and insulation layers 132 and 133 of FIG. 1; e.g., each corresponding structure may be configured to exhibit the same material or features and/or operate substantially the same as its counterpart. For example, conductive layer 340, similar to conductive layer 140 of FIG. 1, may extend beyond the extents of IGBT unit cell 300, for example, and connect to one or more emitters of an array of other IGBT unit cells situated in the same die as IGBT unit cell 300, for example.

SFM layer 348 may comprise any solderable metal, for example, such as Ti, Ni, Ag, or any alloy of those, that can be formed over conductive layer 340 so as to provide a relatively low-resistance coupling to conductive clip 380. In some embodiments, SFM layer 348 may comprise a metal having a thickness of approximately one micron. In one embodiment, SFM layer 348 may comprise a layer of Ag, for example, and be mechanically pressed against conductive clip 380 to couple emitter segment 392 to conductive clip 380. In another embodiment, SFM layer 248 may comprise Ni and a conductive adhesive, such as solder paste (not explicitly shown in FIG. 3), for example, may be used to couple emitter segment 392 to conductive clip 380. In still other embodiments, SFM layer 348 may be absent, where emitter segment 392 comprises only conductive layer 340, for example, and mechanical pressure or a conductive adhesive may be used to couple emitter segment 392 to conductive clip 380.

As with conductive layer 140 of FIG. 1, above, and as shown in FIG. 3, conductive layer 340 and SFM layer 348 may extend beyond the extents of IGBT unit cell 300, for example, and couple to one or more emitters of an array of other IGBT unit cells situated in the same die as IGBT unit cell 300, for example. In some embodiments, conductive layer 340 and SFM layer 346 may be formed into emitter segments of an IGBT, as will be described more fully below with reference to FIGS. 4 and 5.

Conductive clip 380 may comprise any conductive material, such as copper, for example, that can be coupled to emitter segment 392 of IGBT unit cell 300, for example, using mechanical pressure or a conductive adhesive, for instance, and that can be used to conduct current from emitter segment 392 to an emitter pad of a semiconductor package (not shown in FIG. 3). A shape and size of conductive clip 380, which may extend beyond IGBT unit cell 300, for example, will be described more fully below.

As with IGBT unit cell 100 of FIG. 1, above, although FIG. 3 presents an IGBT unit cell 300 with a specific arrangement of material layers, including SFM layer 348, for example, it should be understood that this is not meant to limit the scope of the present invention. Other material arrangements for an IGBT unit cell according to the present inventive concepts may alternatively or additionally be used to form embodiments of the present invention, for example, as long as those unit cells include at least a gate, a collector, and an emitter coupled to a conductive layer similar to conductive layer 340, for example, where the collector and the emitter may be configured to conduct current vertically through an IGBT comprising one or more IGBT unit cells, and where the conductive layer may be subsequently coupled to conductive clip 380.

Figure 4:
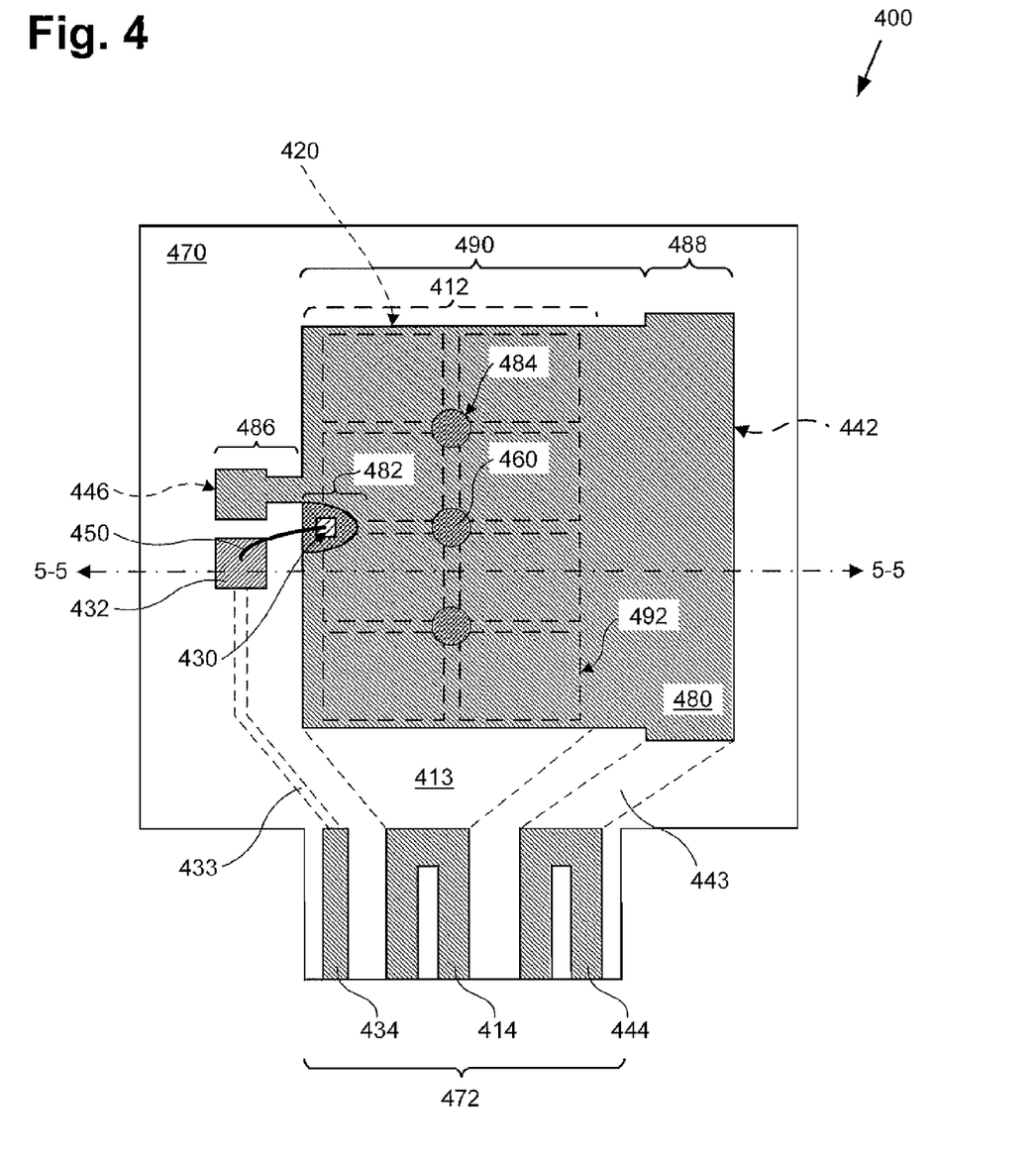
FIG. 4 shows a top view of a power semiconductor package for an IGBT, according to an embodiment of the present invention.

Turning to FIG. 4, in FIG. 4 the dashed-line rectangles represent the outline of each emitter segment 492 situated under and hidden from view by conductive clip 480, where emitter segments 492 are separated from each other by a passivation material, such as passivation material 460. Although eight emitter segments (such as emitter segment 492) are shown in the embodiment shown in FIG. 4, it is understood that any number of emitter segments (greater or fewer than eight) can be utilized according to the concepts of the present invention; and the present invention is not in any way limited to using eight emitter segments which are shown only by way of a specific example in FIG. 4. Thus, FIG. 4 illustrates power semiconductor package 400 utilizing conductive clip 480 to couple emitter segments 492 of IGBT 420 to emitter pad 442 of power semiconductor package 400. As shown in FIG. 4, collector pad 412, collector trace 413, collector terminal 414, gate 430, gate pad 432, gate trace 433, gate terminal 434, emitter pad 442, emitter trace 443, emitter terminal 444, emitter sensor pad 446, bond wire 450, passivation material 460, package substrate 470 and terminal block 472 correspond respectively to collector pad 212, collector trace 213, collector terminal 214, gate 230, gate pad 232, gate trace 233, gate terminal 234, emitter pad 242, emitter trace 243, emitter terminal 244, emitter sensor pad 246, bond wire 250, passivation material 260, package substrate 270 and terminal block 272 of FIG. 2; e.g., each corresponding structure may be configured to exhibit the same material or features and/or operate substantially the same as its counterpart. Moreover, conductive clip 480 and emitter segments 492 correspond respectively to conductive clip 380 and emitter segment 392 of FIG. 3; e.g., each corresponding structure may be configured to exhibit the same material or features and/or operate substantially the same as its counterpart.

For example, emitter segments 492 situated atop IGBT 420 of FIG. 4, similar to emitter segment 392 of FIG. 3, may comprise SFM layers coating conductive layers in contact with one or more P+ type implant regions of IGBT unit cells, which may be configured to serve as an emitter for IGBT 420, and where IGBT 420 comprises one or more IGBT unit cells, such as IGBT unit cell 300 of FIG. 3. In such case, emitter segments 492 may comprise a plurality of SFM coated emitter segments coupled to conductive clip 480, for example, which may in turn couple emitter segments 492 to emitter pad 442 on package substrate 270. In other embodiments, however, emitter segments 492 may not include an SFM layer, but still be coupled to conductive clip 480 in order for conductive clip 480 to couple emitter segments 492 to emitter pad 442.

It should be noted that emitter segments 492 may be shaped and sized to reduce an unevenly distributed stress and strain across a surface of an IGBT caused by differing coefficients of thermal expansion. One such configuration is shown in FIG. 4, where dashed lines represent the extents of each of emitter segments 492 situated under and hidden from view by conductive clip 480, for example, and where emitter segments 492 may be separated from each other by a passivation material, such as passivation material 460. This may be particularly helpful to increase a reliability of relatively thin IGBTs including SFM coated emitter segments, as described above, and to reduce instances of die buckling and cracking due to repetitive thermal cycling.

As shown in FIG. 4, conductive clip 480 includes conductive clip leg 488 coupled to hidden emitter pad 442 and conductive clip body 490 coupled to emitter segments 492. Conductive clip leg 488 may be configured to have a shape (e.g., as seen from above) similar emitter pad 442, for example, so that conductive clip 480 may couple to emitter pad 442 over substantially all of a surface area of emitter pad 442. Conductive clip body 490 may be separately configured to have a shape similar to a top surface of IGBT 420, for example, so that conductive clip 480 may couple to emitter segments 492, for example, over substantially all of a total surface area of emitter segments 492, or a total surface area of a top surface of IGBT 420.

By comprising separately configurable conductive clip leg 488 and conductive clip body 490, conductive clip 480 is able to minimize its total size while maximizing a cross sectional area with which to conduct current from emitter segments 492, for example, to emitter pad 442. This substantially reduces a resistance of conductive clip 480 relative to other emitter/emitter pad coupling methods, for example, and also significantly reduces current spreading, and therein current spreading resistance, within conductive clip 480. Furthermore, in part because a cross-sectional area with which to conduct current is maximized, with respect to emitter pad 442, an overall size of IGBT 420 and power semiconductor package 400 may be reduced relative to, for example, IGBT 220 and bond wire semiconductor package 200 of FIG. 2, for a particular current rating. For instance, IGBT 420 and power semiconductor package 400 may be forty to sixty percent the length and height of IGBT 220 and semiconductor package 200, respectively, yet be capable of supporting the same maximum current rating because of the additional current carrying ability and reduced resistance of conductive clip 480. Thus, embodiments of the present invention are more scalable with miniaturization of IGBTs than conventional bond wire packages.

Additionally, conductive clip leg 488 and conductive clip body 490 of conductive clip 480 may be configured to present a substantially flat top surface that is suitable for thermal sinking (i.e. heat dissipation). By combining this top surface with a bottom surface of power semiconductor package 400, embodiments of the present invention may provide dual sided cooling of power semiconductor package 400, which, in addition to increasing the power handling capability of the package generally, may also reduce the extents of temperature swings during thermal cycling and therefore reduce a risk of damage to IGBT 420 and to, for example, a bond wire coupling gate pad 432 to gate 430 of IGBT 420, as explained above. In some embodiments, conductive clip 480 may be configured to increase available heat sinking area by approximately seventy percent over other packaging techniques. Furthermore, in some embodiments of the present inventive concepts, a number of thermal cycles before failure may be approximately 300% higher than numbers for other packaging techniques.

Also shown in FIG. 4 are conductive clip notch 482, conductive clip through-holes 484 and conductive clip sensor finger 486 of conductive clip 480. Conductive clip notch 482 may be configured to allow gate pad 432 to be coupled to gate 430 of IGBT 420, for example, without shorting to conductive clip 480 and without substantially reducing a total surface area of conductive clip body 490 used to couple to emitter segments 492 of IGBT 420. Conductive clip sensor finger 486 may be configured to couple to emitter sensor pad 446 on substrate 470, for example, and to do so without risking shorting emitter pad 446 to gate 430, thereby reliably coupling emitter sensor pad 446 to an emitter of IGBT 420.

By including conductive clip sensor finger 486, embodiments of the present inventive concepts allow for accurate sensing of an emitter voltage without incurring the cost, time and risk to reliability of multiple bond wires. Conductive clip notch 482, on the other hand, allows coupling of gate pad 432 to gate 430 of IGBT 420 using a bond wire 450, which may be a suitable and relatively reliable means to couple gate pad 432 to gate 430 because that coupling does not typically conduct large currents and so does not typically benefit from an increased cross-sectional area with which to conduct current. Moreover, general bond reliability is increased because power semiconductor package 400 including conductive clip 480 offers a substantially increased thermal stability over other packages, as explained above.

As noted above, conductive clip 480 may be coupled to emitter segments 492 using a conductive adhesive, such as solder paste. Such conductive adhesives typically include chemicals or fluxes used to facilitate such coupling when, for example, heat is applied to reflow an already-applied conductive adhesive and form a reliable electrical and mechanical coupling. During such a reflow process, fluxes may evaporate or degass, and such reflow degassing may cause physical irregularities in the resulting coupling that significantly reduce a reliability of the resulting coupling. Conductive clip through-holes 484 in conductive clip body 490 of conductive clip 480 may be configured to allow reflow degassing to escape from the surface area of the coupling between emitter segments 492 and conductive clip body 490, for example, and thereby significantly reduce a risk of physical irregularities arising during the reflow process. Moreover, conductive clip through-holes 484 may be configured to do so without substantially reducing a total surface area used to couple emitter segments 492 to conductive clip body 490 of conductive clip 480, for example, thus increasing reliability without significantly reducing the scalability and current carrying capability of power semiconductor package 400.

Figure 5:
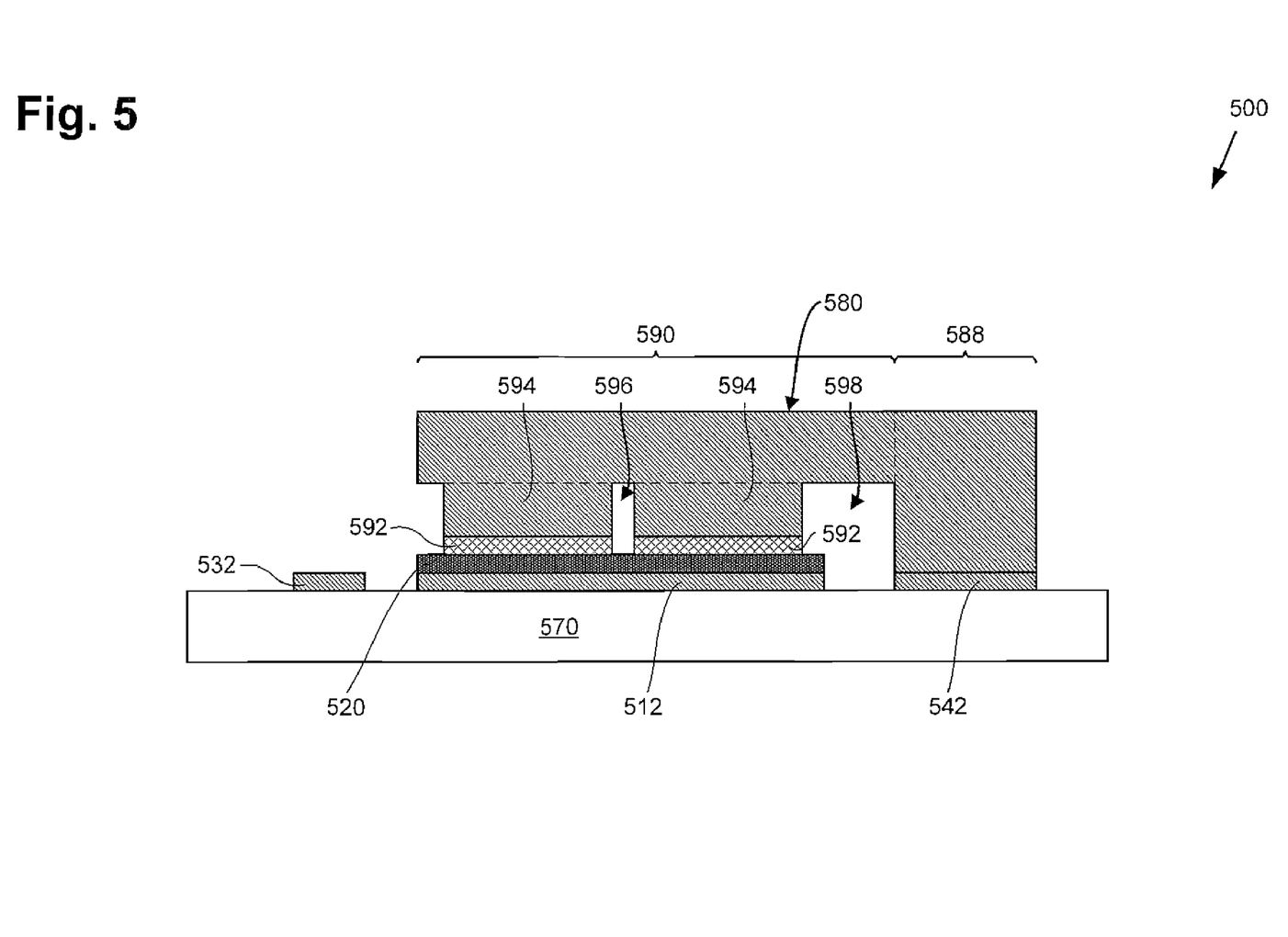
FIG. 5 illustrates a cross section of a power semiconductor package for an IGBT, according to an embodiment of the present invention.

Turning attention to FIG. 5, FIG. 5 shows a cross section of a power semiconductor package 500 similar to power semiconductor package 400 of FIG. 4 taken along line 5-5. As such, collector pad 512, IGBT 520, gate pad 532, emitter pad 542, package substrate 570, emitter segments 592 and conductive clip leg 588 of FIG. 5 correspond respectively to collector pad 412, IGBT 420, gate pad 432, emitter pad 442, package substrate 470, emitter segments 492 and conductive clip leg 488 of FIG. 4; e.g., each corresponding structure may be configured to exhibit the same material or features and/or operate substantially the same as its counterpart. For example, emitter segments 592 situated atop IGBT 520, similar to emitter segments 492 in FIG. 4, may comprise SFM coated emitter segments, or, in other embodiments, may comprise emitter segments that are not coated with an SFM layer.

Also shown in FIG. 5 are conductive clip extensions 594 coupled to conductive clip body 590 of conductive clip 580, and voids 596 and 598. As shown in FIG. 5, in one embodiment of the present inventive concepts, each of emitter segments 592 may be coupled to a corresponding number of conductive clip extensions 594, which may in turn be coupled to conductive clip leg 588 by conductive clip body 590, thereby coupling emitter segments 592 to emitter pad 542 of power semiconductor package 500.

Conductive clip extensions 594 of conductive clip 580 may comprise the same conductive material as conductive clip 590, for example, to simplify fabrication of conductive clip 580, or may comprise a dissimilar conductive material capable of being adhered to conductive clip 590 prior to being coupled to emitter segments 592, for example. For instance, conductive clip extensions 594 may be formed by sputtering Ag onto a copper conductive clip body 590, for example, to enable easier coupling through mechanical pressing to emitter segments 592, for example. In another embodiment, conductive clip leg 588, conductive clip body 590 and conductive clip extensions 594 may all comprise copper, for example, and may be formed out of a single continuous piece of material.

As shown in FIG. 5, conductive clip extensions 594 may also be configured to couple to each of emitter segments 592 over substantially all of the total surface area of emitter segments 592, in order to maximize current carrying ability, as explained above with respect to conductive clip body 490 in FIG. 4. It should be understood that although FIG. 5 features conductive clip extensions 594 used to couple emitter segments 592 to conductive clip body 590, in alternative embodiments, a conductive clip body may couple to emitter segments 592 directly without intervening conductive clip extensions.

As noted above, conductive clip extensions 594 may be coupled to emitter segments 592 through mechanical pressing, for example, but in addition, may be coupled to emitter segments 592 using a conductive adhesive. Where emitter segments 592 are coupled to conductive clip extensions 594 using a conductive adhesive, conductive clip extensions 594 may be spaced from each other to form one or more voids, such as void 596, for example, which, similar to conductive clip through-holes 484 of FIG. 4, may be used to allow reflow degassing to escape and thereby increase that coupling's reliability, as explained above. Moreover, as shown in FIG. 5, conductive clip extensions may be configured to form void 596 without substantially reducing a total surface area used to couple emitter segments 592 to conductive clip extensions 594 of conductive clip 580, for example, thus increasing reliability without significantly reducing the scalability and current carrying capability of power semiconductor package 500.

Similarly, conductive clip 580 may be configured to form a void, such as void 598, for example, between emitter pad 542 and IGBT 520. Analogous to void 596, void 598 may be configured to allow reflow degassing to escape from conductive adhesive used to couple emitter segments 592 to conductive clip extensions 594, for example, without reducing a total surface area of that coupling. In addition, however, where conductive clip leg 588 is coupled to emitter pad 542 using a conductive adhesive, void 598 may also be configured to allow reflow degassing, for example, arising from that coupling. In particular, a thickness of conductive clip leg 588 and a thickness of conductive clip body 590 (e.g., measured vertically in FIG. 5) may be configured to form void 598 between emitter pad 542 and IGBT 520, for example, sufficiently to allow for reflow degassing, for example, or to mitigate other issues related to a proximity of conductive clip 580 to portions of IGBT 520, collector pad 512, or other structures on package substrate 570. In some embodiments, conductive clip leg 588 may be substantially thicker than IGBT 520, for example, such as two millimeters thick compared to a seventy micron thick IGBT, for example, in order to create void 598 while providing sufficient current carrying ability for power semiconductor package 500.

It should be noted that in some embodiments, conductive clip leg 588 of conductive clip 580 may be electrically and mechanically coupled to emitter pad 542, for example, using conductive adhesive, as explained above, or using a different mechanical coupling means, such as welding or a mechanical pressing. Furthermore, although the present inventive concepts have been explained in the context of packaging an IGBT, it should be understood that the present inventive concepts may be used to package any vertical conduction power semiconductor device similarly sized to a power IGBT, for example, such as power diode.

By providing a conductive clip used to couple a number of emitter segments of an IGBT to an emitter pad of a power semiconductor package, embodiments of the present invention provide a power semiconductor package for an IGBT that can be miniaturized without reducing its maximum current rating, which facilitates smaller and lighter power semiconductor devices used in power conversion technologies. Moreover, a conductive clip similar to conductive clip 580 of FIG. 5 or 480 of FIG. 4 exhibits a relatively uniform current carrying capability, which allows embodiments of the present inventive concepts to have better operational performance and conduct much higher currents than conventional packaging techniques using, for example, bond wires. Such conventional packaging techniques may be susceptible to operational failures, such as localized fatigue, for example, when a single current-carrying bond wire partially releases from a bond site. Additionally, a conductive clip according to the present inventive concepts may be configured to substantially increase a thermal stability of an IGBT package relative to other packaging techniques, which increases a reliability of a power semiconductor package as a whole while reducing the cost and complexity of alternative means to thermally sink the power semiconductor package.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A power semiconductor package comprising:
an insulated-gate bipolar transistor (IGBT) residing on a package substrate, said IGBT including a plurality of solderable front metal (SFM) coated emitter segments situated atop said IGBT and connected to an emitter of said IGBT;
a conductive clip coupling said plurality of SFM coated emitter segments to an emitter pad on said package substrate;
a gate pad on said package substrate coupled to a gate of said IGBT;
a collector pad on said package substrate situated under said IGBT and coupled to a collector of said IGBT;
an emitter terminal, a collector terminal, and a gate terminal of said package substrate being routed to said emitter pad, said collector pad, and said gate pad, respectively.

2. The package of claim 1, wherein said conductive clip comprises copper.

3. The package of claim 1, wherein said plurality of SFM coated emitter segments comprise a metal selected from the group consisting of Ti, Ni and Ag.

4. The package of claim 1, wherein said conductive clip is coupled to said emitter pad over substantially all of said emitter pad.

5. The package of claim 1, wherein said conductive clip is coupled to said plurality of SFM coated emitter segments over substantially all of a total surface area of said plurality of SFM coated emitter segments.

6. The package of claim 1, wherein said conductive clip is coupled to said emitter pad using a conductive adhesive.

7. The package of claim 1, wherein said conductive clip is coupled to said SFM coated emitter segments using a conductive adhesive.

8. The package of claim 1, wherein said conductive clip comprises at least one through-hole configured to allow reflow degassing.

9. The package of claim 1, wherein said conductive clip is configured to form a void between said emitter pad and said IGBT.

10. The package of claim 1, wherein said conductive clip comprises a conductive clip notch to allow coupling to said gate of said IGBT.

11. The package of claim 1, wherein said conductive clip comprises a conductive clip sensor finger configured to couple an emitter sensor pad on said package substrate to said emitter of said IGBT.

12. The package of claim 1, wherein said conductive clip is configured to present a substantially flat top surface suitable for thermal sinking.

13. The package of claim 1, wherein said emitter terminal, said collector terminal, and said gate terminal form a terminal block situated on one edge of said package substrate.

14. The package of claim 1, wherein said conductive clip comprises a plurality of conductive clip extensions corresponding to said plurality of SFM coated emitter segments; said plurality of conductive clip extensions configured to couple said SFM coated emitter segments to a conductive clip body of said conductive clip.

15. A conductive clip for an insulated-gate bipolar transistor (IGBT) package, said conductive clip comprising:
a plurality of conductive clip extensions coupled to a corresponding plurality of emitter segments of an IGBT, said plurality of emitter segments situated atop said IGBT and connected to an emitter of said IGBT, said IGBT residing on a package substrate;
a conductive clip leg coupled to an emitter pad on said package substrate;
a conductive clip body coupling said plurality of conductive clip extensions to said conductive clip leg;
said package including a collector pad on said package substrate situated under said IGBT and coupled to a collector of said IGBT.

16. The conductive clip of claim 15, wherein said conductive clip leg is electrically and mechanically coupled to said emitter pad.

17. The conductive clip of claim 15, wherein said plurality of conductive clip extensions are spaced from each other sufficiently to allow reflow degassing.

18. The conductive clip of claim 15, wherein said plurality of conductive clip extensions are coupled to said plurality of emitter segments over substantially all of a total surface area of said plurality of emitter segments.

19. The conductive clip of claim 15, wherein a thickness of said conductive clip leg and a thickness of said conductive clip body are configured to form a void between said emitter pad and said IGBT die.

20. The conductive clip of claim 15, wherein each of said conductive clip leg, said conductive clip body, and said conductive clip extensions comprise copper.

* * * * *